United States Patent
Virkar et al.

(10) Patent No.: US 8,530,271 B2
(45) Date of Patent: Sep. 10, 2013

(54) FULLERENE-DOPED NANOSTRUCTURES AND METHODS THEREFOR

(75) Inventors: Ajay Virkar, Stanford, CA (US); Melburne C. Lemieux, La Honda, CA (US); Zhenan Bao, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 336 days.

(21) Appl. No.: 13/011,402

(22) Filed: Jan. 21, 2011

(65) Prior Publication Data

US 2011/0204319 A1    Aug. 25, 2011

Related U.S. Application Data

(60) Provisional application No. 61/298,043, filed on Jan. 25, 2010.

(51) Int. Cl.
*H01L 51/40*    (2006.01)

(52) U.S. Cl.
USPC ........ 438/99; 257/E51.04; 977/734; 977/735; 977/742; 977/749

(58) Field of Classification Search
USPC ............. 438/99; 257/E51.04; 977/734, 735, 977/742, 749
See application file for complete search history.

(56) References Cited

U.S. PATENT DOCUMENTS

| | | |
|---|---|---|
| 5,380,703 A | 1/1995 | Kao et al. |
| 5,416,243 A | 5/1995 | Bekiarian et al. |
| 5,558,903 A | 9/1996 | Bhushan et al. |
| 6,386,468 B1 | 5/2002 | Neuberger et al. |
| 6,890,676 B2 | 5/2005 | Nuber et al. |
| 7,060,241 B2 | 6/2006 | Glatkowski |
| 7,122,710 B2 | 10/2006 | Margrave et al. |
| 7,129,003 B2 | 10/2006 | Cagle |
| 7,261,852 B2 | 8/2007 | Rinzler et al. |
| 7,531,157 B2 | 5/2009 | Ford et al. |
| 7,535,462 B2 | 5/2009 | Spath et al. |
| 7,604,757 B2 | 10/2009 | Yasuda |
| 8,119,445 B2 | 2/2012 | Virkar et al. |
| 2003/0089899 A1 | 5/2003 | Lieber et al. |
| 2004/0004212 A1 | 1/2004 | Crespi et al. |
| 2004/0142172 A1 | 7/2004 | Sugiyama et al. |
| 2004/0194705 A1 | 10/2004 | Dai et al. |
| 2004/0265550 A1 | 12/2004 | Glatkowski et al. |
| 2005/0130395 A1 | 6/2005 | Tada et al. |
| 2006/0067870 A1 | 3/2006 | Park et al. |

(Continued)

FOREIGN PATENT DOCUMENTS

| | | |
|---|---|---|
| WO | WO 2007/057501 | 5/2007 |
| WO | WO 2010/029542 | 3/2010 |

OTHER PUBLICATIONS

A.M. Morales and C.M. Lieber, "A Laser Ablation Method for the Synthesis of Crystalline Semiconductor Nanowires," Science, vol. 279, pp. 208-210, (Jan. 1998).

(Continued)

*Primary Examiner* — Minh-Loan T Tran
(74) *Attorney, Agent, or Firm* — Crawford Maunu PLLC

(57) ABSTRACT

Nanostructures are doped to set conductivity characteristics. In accordance with various example embodiments, nanostructures such as carbon nanotubes are doped with a halogenated fullerene type of dopant material. In some implementations, the dopant material is deposited from solution or by vapor deposition, and used to dope the nanotubes to increase the thermal and/or electrical conductivity of the nanotubes.

26 Claims, 3 Drawing Sheets

(56) References Cited

U.S. PATENT DOCUMENTS

| | | |
|---|---|---|
| 2007/0108439 A1 | 5/2007 | Silverbrook |
| 2007/0108480 A1 | 5/2007 | Nanai et al. |
| 2007/0137786 A1 | 6/2007 | Luzzi |
| 2007/0243124 A1 | 10/2007 | Baughman et al. |
| 2007/0255002 A1 | 11/2007 | Alba |
| 2008/0001141 A1 | 1/2008 | Gruner et al. |
| 2008/0017847 A1 | 1/2008 | Darsey et al. |
| 2008/0170982 A1 | 7/2008 | Zhang et al. |
| 2008/0191606 A1 | 8/2008 | Geohegan et al. |
| 2008/0203380 A1 | 8/2008 | Wang et al. |
| 2008/0210052 A1 | 9/2008 | Allemand |
| 2008/0210370 A1 | 9/2008 | Smalley |
| 2008/0241262 A1 | 10/2008 | Lee et al. |
| 2008/0259262 A1 | 10/2008 | Jones et al. |
| 2009/0155460 A1 | 6/2009 | Ruoff |
| 2009/0226704 A1 | 9/2009 | Kauppinen et al. |
| 2009/0228131 A1 | 9/2009 | Wolk et al. |
| 2009/0320911 A1 | 12/2009 | Ruoff |
| 2010/0001255 A1 | 1/2010 | Bao et al. |
| 2010/0003781 A1 | 1/2010 | Van Duren et al. |
| 2010/0012923 A1 | 1/2010 | Hiura et al. |
| 2011/0204319 A1 | 8/2011 | Virkar et al. |

OTHER PUBLICATIONS

C. Journet et al., "*Large-scale production of single-walled carbon nanotubes by the electric-arc technique*," Letters to Nature, vol. 388, pp. 756-758, (Aug. 1997).

C.L. Cheung et al., "*Diameter-Controlled Synthesis of Carbon Nanotubes*," The Journal of Physical Chemistry B, vol. 106, No. 10, pp. 2429-2433, (Feb. 2002).

A.A. Puretzky et al., "*Investigations of single-wall carbon nanotube growth by time-restricted laser vaporization*," The American Physical Society Review B, vol. 65, No. 24, pp. 245425, (Jun. 2002).

M. Terrenes et al., "*Molecular Junctions by Joining Single-Walled Carbon Nanotubes*," Physical Review Letters, vol. 89, No. 7, pp. 1-4, (Aug. 2002).

D.N. Madsen et al., "*Soldering of Nanotubes into Microelectrodes*," Nano Letters, vol. 3, No. 1, pp. 47-49, (Sep. 2002).

B.I. Yakobson et al., "*Carbon Nanotubes: Supramolecular Mechanics*," Dekker Encycl. Of Nanoscience and Nanotechnology, pp. 587-601 (2004).

F. Banhart, "*Formation and transformation of carbon nanoparticles under electron irradiation*," Philosophical Transactions of the Royal Society A, vol. 362, No. 1823, pp. 2205-2222, (Oct. 2004).

N.P. Armitage et al., "*Quasi-Langmuir-Blodgett thin film deposition of carbon nanotubes*," Journal of Applied Physics, vol. 95, No. 6, pp. 3228-3230, (Mar. 2004).

M. Stadermann et al., "*Nanoscale study of conduction through carbon nanotube networks*", Phys. Rev. B, vol. 69, pp. 201402, 1-3, (2004).

M. Kaempgen et al., "*Transparent carbon nanotube coatings*," Applied Surface Science, vol. 252, pp. 425-429, (Feb. 2005).

C.M. Trottier et al., "*Properties and characterization of carbon-nanotube-based transparent conductive coating*," Proc. Soc. Inf. Display, vol. 13, No. 9, pp. 759-763, (2005).

J. Vavro et al., "*Metal-insulator transition in doped single-wall carbon nanotubes*," Phys. Rev. B, vol. 71, No. 15, pp. 155410, 1-11, (2005).

J.S. Moon et al., "*Transparent conductive film based on carbon nanotubes and PEDOT composites*," Diamond and Related Materials, vol. 14, No. 11-12, pp. 1882-1887, (2005).

M.C. LeMieux et al., "*Polymeric nanolayers as actuators for ultrasensitive thermal bimorphs*," Nano Letters, vol. 6, No. 4, pp. 730-734, (Apr. 2006).

J.C. Miller and D.L. Harris, "*The Carbon Nanotube Patent Landscape*," Nanotechnology Law & Business, vol. 3, No. 4, pp. 427-454, (Dec. 2006).

Y.-X. Zhou, et al., "*A method of printing arbon nanotube thin films*," Appl. Phys. Lett., vol. 88, pp. 123109, 1-3, (2006).

A.R. Boccaccino, et al., "*Electrophoretic deposition of carbon nanotubes*," Carbon, vol. 44, pp. 3149-3160, (2006).

Y.-S. Lee and N. Marzari, "*Cycloaddition functionalizations to preserve or control the conductance of carbon nanotubes*," Phys. Rev. Lett., vol. 97, No. 11, pp. 116801, 1-4, (2006).

M.A. Kuroda and J.-P. Leburton, "*Joule heating induced negative differential resistance in freestanding metallic carbon nanotubes*," Appl. Phys. Lett., vol. 89, pp. 103102, 1-3, (2006).

A.G. Nasibulin et al., "*A novel hybrid carbon material*," Nature Nanotechnology, vol. 2, pp. 156-161, (Feb. 2007).

A.V. Krasheninnkov and F. Banhart, "*Engineering of nanostructured carbon materials with electron or ion beams*," Nature Materials, vol. 6, pp. 723-733, (2007).

M.C. LeMieux et al., "*Self-sorted, aligned nanotube networks for thin-film transistors*," Science, vol. 321, No. 27, pp. 101-104, (Jul. 2008).

H. Chaturvedi, "*Photon Induced Effects in Molecular Assemblies of Single Walled Carbon Nanotubes*," Dissertation online, pp. 1-56 (Dec. 2008).

S.L. Hellstrom et al., "*Polymer-assisted Direct Deposition of Uniform Carbon Nanotube Bundle Networks for High Performance Transparent Electrodes*," American Chemical Society Nano, vol. 3, No. 6, pp. 1423-1430, (May 2009).

J. Hart, "*Organization and properties of nanostructure networks*," Nanomanufacturing, University of Michigan, 46 pgs. (Apr. 2009).

L.B. Johnson Space Center and J.H. Glenn Research Center, "*Progress Toward Sequestering Carbon Naotubes in PmPV*," "*Computer Code for Nanostructure Simulation*," "*Functionalizing CNTs for Making Epoxy/CNT Composites*," "*Improvements in Production of Single-Walled Carbon Nanotubes*," NASA Tech Briefs, (Sep. 2009).

A. Ishaq et al., "*The electrical conductivity of carbon nanotube sheets by ion beam irradiation*," Nuclear Instruments and Methods in Physics Research B, vol. 267, pp. 1779-1782, (2009).

A. Velamakanni et al., "*Site-Specific Deposition of Au Nanoparticles in CNT Films by Chemical Bonding*," American Chemical Society Nano, vol. 4, No. 1, pp. 540-546, (Jan. 2010).

US 8,530,271 B2

FULLERENE-DOPED NANOSTRUCTURES AND METHODS THEREFOR

RELATED PATENT DOCUMENT

This patent document claims benefit under 35 U.S.C. §119 to U.S. Provisional Patent Application Ser. No. 61/298,043, entitled "Fullerene-Doped Nanostructures" and filed on Jan. 25, 2010; this Provisional Patent Application is fully incorporated herein by reference.

FEDERALLY-SPONSORED RESEARCH AND DEVELOPMENT

This invention was made with Government support under contracts HM1582-07-1-2009 awarded by the National Geospatial-Intelligence Agency and 0213618 awarded by the National Science Foundation. The U.S. Government has certain rights in this invention.

FIELD

The present invention relates generally to nanostructures, and more specifically, to doped nanostructures and methods therefor.

BACKGROUND

Nanostructures, such as carbon nanotube (CNT) and graphene-based materials, have been increasingly used in a multitude of disparate applications. For example, some CNT-based applications have involved electronic circuits, bio-functionalized devices, transistors, displays, touch screens, OLEDs, e-readers, solar cells and sensors for security, chemical, and biological applications. In many of these applications, thin, highly conductive materials are desirable.

For many of these applications, manufacturing nanotubes having consistent properties has been difficult under many conditions, and particularly under high-volume production conditions. For example, nanotubes often have different shapes, or chiralities, and different conductivity and electronic characteristics (e.g., nanotube fabrication can result in both semiconducting and metallic nanotubes).

In view of the above, nanostructures such as nanotubes and graphene have been manipulated or otherwise modified to suit specific applications. For instance, carbon nanotubes have been doped using dopants such as iodine, silver chloride and thionyl chloride, which can improve the conductivity of CNTs. However, such dopants can be challenging to implement for large-scale manufacturing and real-world applications. For example, certain dopants involve or otherwise require the use of gases that are undesirable (e.g., toxic) or difficult to use, and many dopants have not been capable of use in forming doped structures that are stable over time. Certain dopants can degrade carbon nanotubes and other organic materials over time, preventing encapsulation and making the doped structures unsuitable for many applications. In addition, many approaches to doping or otherwise modifying carbon nanotubes have involved undesirable and/or expensive manufacturing processes, such as those involving high heat or lengthy throughput.

These and other issues remain as a challenge to a variety of methods, devices and systems that use or benefit from nanostructures.

SUMMARY

Various aspects of the present invention are directed to devices, methods and systems involving nanostructures that address challenges including those discussed above.

According to an example embodiment, a nanostructure is doped using a fullerene-based material. The fullerene-based material, such as a halogenated fullerene (e.g., a fluorinated fullerene), is applied to the nanostructure and nucleated. The nucleated fullerene-based material dopes the nanostructure with a dopant from the nucleated fullerene-based material.

Another example embodiment is directed to a method for doping a nanostructure, as follows. A fullerene-based material is applied to an outer surface of the nanostructure. This fullerene-based material has a Fermi level that is below the Fermi level and/or the conduction band energy of the nanostructure, and is used to grow a fullerene-based dopant material on the nanostructure. The surface of the nanostructure is doped with a dopant from the fullerene-based dopant material to form a hybrid material including a portion of the nanostructure and the dopant. The hybrid material exhibits a conductivity that is greater than a conductivity of the nanostructure, prior to doping via the fullerene-based dopant material.

Another example embodiment is directed to a method for doping a carbon-based nanowire, such as a single nanowire and/or a portion of a circuit. A fullerene-based material, which includes a material selected from the group of $C_{60}F_{18}$, $C_{60}F_{24}$, $C_{60}F_{36}$, $C_{60}F_{48}$, $C_{60}F_{44}$ and $C_{70}F_{54}$ is applied to a carbon-based nanowire. The (fluorinated) fullerene-based material is nucleated to form a nucleated fullerene-based material on the carbon-based nanowire circuit, and to dope the carbon-based nanowire circuit with the (fluorinated) fullerene.

Another example embodiment is directed to a carbon-based nanowire having a semiconducting carbon-based nanomaterial and a conductive hybrid material, which includes a halogenated (e.g., fluorinated) fullerene dopant and the carbon-based nanomaterial. The hybrid material exhibits a conductivity that increases the conductivity of the semiconducting carbon-based nanowire, relative to the conductivity of the carbon-based nanomaterial.

The above summary is not intended to describe each embodiment or every implementation of the present disclosure. The figures and detailed description that follow more particularly exemplify various embodiments.

BRIEF DESCRIPTION OF THE DRAWINGS

The invention may be more completely understood in consideration of the following detailed description of various embodiments of the invention in connection with the accompanying drawings, in which.

Figure 1:
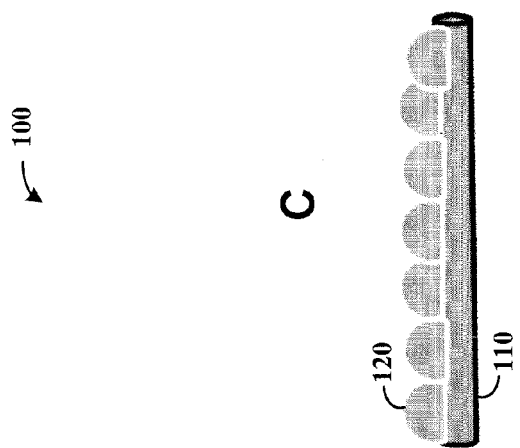
FIG. 1 shows a nanostructure at various stages of a doping process, according to an example embodiment of the present invention.
Figure 1:
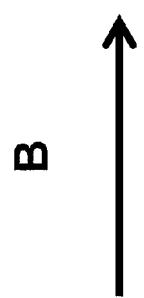
Figure 1:
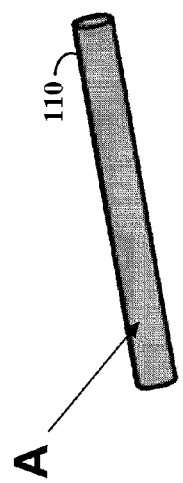

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims.

DETAILED DESCRIPTION

The present invention relates to doping nanomaterials as described herein. While the present invention is not necessarily limited to such devices and applications, various aspects of the invention may be appreciated through a discussion of examples using these and other contexts.

According to an example embodiment, halogenated fullerenes are used to dope nanostructures such as carbon nanotubes. In one embodiment, one or more fluorinated fullerene dopants are deposited, grown or otherwise placed onto carbon or inorganic based nano/micro structures. The intimate contact of the dopant(s) with the nano/micro structure is used to effect the charge transfer and doping of the nano/micro structure, to set (e.g., improve) the nano/micro structure's electrical and/or thermal conductivity. In certain applications, the dopants also enhance the strength, rigidity or other mechanical properties of the nano/micro structure.

The dopant material can be deposited or otherwise formed upon a target structure using a variety of approaches. In some applications, the dopant is deposited from a vapor phase, such as by using thermal vapor deposition. In other applications, the dopant is deposited from a solution. Still other applications involve the deposition of a dopant from other approaches, or using a combination of approaches (e.g., solution-based and vapor-based deposition), which can be carried out concurrently and/or in different steps. Once deposited or formed, the dopant material is used to dope the target structure, and may be further modified via treatment (before or after doping).

A variety of dopants can be used for different applications. In some applications, the dopant is selected and used to increase the conductivity of a micro/nano structure by more than two orders of magnitude. For various applications, dopants are selected for stability, and used to generate an electronic and/or thermal device that exhibits stable doped properties over time (e.g., indefinitely in ambient temperature conditions and/or up to and exceeding about 250 degrees Celsius).

In many applications, a dopant that is selective to the nano/micro structure to which it is applied is used to dope the nano/micro structure. For example, in many applications, it is desirable to limit the deposition of a dopant to a particular nanostructure. Accordingly, one or more dopant materials that selectively grow upon the particular nanostructure, relative to surrounding nanostructures and/or an underlying substrate, are grown on the nanostructure while mitigating or eliminating the growth of the dopant materials upon other structures.

In connection with various example embodiments, halogenated fullerenes are used to dope carbon and inorganic nano/micro structures for applications including nano/micro tube or wire-based electronic devices such as transistors, displays, touch screens, sensors, electronic paper (e-paper), electronic readers (e-readers), flexible electronic devices, solar cells, thermal conductors, and composite materials. The dopant is chosen to stably and efficiently dope semiconducting nano/micro structures to set the conductivity level of the structures, such as by increasing the conductivity of a semiconducting nanotube and/or by doping a semiconducting nanotube to form a metallic nanotube. For various applications, the dopant is chosen to set electrical charge transport characteristics of a nano/micro structure as described herein.

In these contexts, the term doping refers to the addition of one or more materials in contact with the nano/micro structure. The additional doping material, or dopant, introduces free and mobile charges into the conduction band of the nano/micro structures. The addition of the free mobile charges in the conduction band is used to set or change the electronic and thermal behavior of a semiconducting material, such as to modify this behavior to resemble structures having metallic-like characteristics. More detail with regard to exemplary doped nano/micro structures, and dopants used, is discussed below.

In some example embodiments, nanotubes are doped using one or more dopants selected from a class of fluorinated fullerene derivatives having the molecular formula:

In some example embodiments, nanotubes are doped using one or more dopants selected from a class of halogenated fullerene derivatives and at least part of the molecular formula contains:

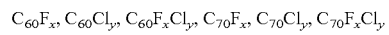

$C_{60}F_x, C_{60}Cl_y, C_{60}F_xCl_y, C_{70}F_x, C_{70}Cl_y, C_{70}F_xCl_y$ where X=1-55, for C60 and less than 65 for C70. More preferably, X=18, 24, 36, 48, 54 or 56.
Where Y=1-55, for C60, and less than 65 for C70. More preferably, Y=4, 6, 24, 36, 48, 54, or 56.

The nanostructure that is doped includes one or more of an individual nanotube, carbon fiber, nanowire, carbon nanotube or other nano/micro structure as described herein.

In some embodiments, carbon nanotubes (CNTs) and/or carbon fibers are doped using a fluorinated fullerene having the formula $C_{60}F_x$ as discussed above. For several applications as described herein, a mixture of semiconducting and metallic tubes is modified via doping with such a fluorinated fullerene to dope the semiconducting tubes, and increase the overall thermal and/or electrical conductivity of the mixture. The carbon-based nano/micro structure may include one or more of single walled carbon nanotubes (SWNT) or multi-walled carbon nanotubes (MWCNT), and may include such nanotubes of one or more chiralities. In addition, the carbon-based nano/micro structure may include a bundle of nanotubes, CNTs or a carbon fiber.

Other embodiments are directed to the doping of a graphene-based structure, in which one to several thin layers of graphene is/are doped to suit a particular application or applications. For example, graphene layers can be doped to set their conductivity or other properties to a selected level for one or more of electronic, thermal, and high strength applications. In some implementations, graphene oxide or reduced graphene oxide is doped for such applications, including those desirably involving certain processing characteristics that are achieved using graphene oxide. These approaches (doping of graphene and graphene oxide) are amenable for improving electronic and thermal conductivities of such structures to create viable components in many applications and are suitable for various technologies.

In accordance with another example embodiment, inorganic nano/micro structures such as inorganic semiconductors are doped using a halogenated fullerene as discussed herein, to form electronic circuits and/or devices. In some applications, inorganic micro/nano structures such as those including zinc oxide, silicon, germanium; metal/non-metal semiconductors such as cadmium telluride, zinc-sulfide, titanium nitride, and copper indium gallium selenide; and other metal/non-metal oxides are doped to form electronic circuits.

The various embodiments as described herein may be implemented in connection with one or more of the figures and/or example embodiments. As used in connection with various example embodiments herein (above and as follows), the term "nanostructure" may refer to structures having dimensional characteristics on a nanometer scale, such as carbon nanotubes often having a diameter in the range of about one nanometer (and lengths that may well exceed thousands of nanometers). In other embodiments, the term "nanostructure" refers to structures having dimensional characteristics on the scale of hundreds of nanometers, nearing (and perhaps exceeding) one micrometer, such as carbon fibers having diameters ranging from several hundred nanometers to several micrometers.

In addition, the doping approaches described herein are applicable to doping single nanostructures, such as a single CNT or graphene particle, or to doping a multitude of such structures, which may be arranged in the form of a wire, circuit, sheet or other device. For instance, some applications are directed to doping CNTs that are joined or otherwise connected, using approaches such as laser ablation, soldering, substrate fixation and welding. For certain embodiments, the doping approach described herein may facilitate such joining as well (e.g., deposited dopant materials may also act to join nanostructures), and may also facilitate the enhancement of the mechanical strength of the structures that are doped.

In certain embodiments, nanostructures such as CNTs or graphene are dispersed in a solution, such as a surfactant or polymer-based solution, and deposited from the solution. In these embodiments, surfactants or polymers may cover some of or the entire surface of the CNT or graphene, and a dopant material as described herein is deposited on the covered surface. Charge transfer in such structures may be effected either through exposed regions of the CNT or graphene, or via charge transfer to the coating on the surface and further through the coating to the CNT or graphene.

In various contexts, the terms "nanowire" and "circuit" as described herein apply to a conductor that forms part of a circuit, and/or to a circuit having a conductor and other components. For example, the term circuit may refer to a conductor or conductive sheet that can be powered and coupled to one or more circuit components. The term circuit may also refer to such a conductor or conductive sheet, along with one or more circuit components.

Turning now to the Figures, FIG. 1 shows a nanostructure 100 at various stages of a doping process, according to another example embodiment of the present invention. A nanotube 110 at A is shown by way of example, while the approach shown and described as follows can be used in connection with a variety of nanostructures or microstructures, as discussed above. For example, one or more of CNTs, single-walled nanotubes (SWNTs), multi-walled carbon nanotubes (MWCNTs), carbon fibers, nanowires, nanomaterial tows, and nanomaterial ropes (e.g., bundles of ranging diameter) can be formed as shown. Different types of nanomaterials may also be used, such as those discussed above, nanotubes with varying chirality (e.g., semiconducting or metallic), semiconducting nanotubes, metallic nanotubes, inorganic and organic nanowire (e.g., with one or more of ZnO, Ag, Au or Si), or a combination thereof. In addition, while one nanotube 110 is shown, a multitude of such nanotubes (or nanostructures) can be doped as described herein, concurrently and/or as part of different manufacturing steps.

The resulting structure may be used to form a variety of devices such as a conductive wire, circuits and/or an entire film of these nanostructures. The density, alignment, length, and overall thickness (e.g., ranging from 1-100 nm or much higher) of the dopant upon the nanotube 110 can also be set to suit particular applications. In addition, the nanotube 110 can be free standing or formed upon a substrate.

A dopant material is deposited on the nanotube 110 at B, such as from solution or from vapor, and the deposited dopant material 120 is used to dope the nanotube at C to set (e.g., increase) the conductivity of the nanotube. The dopant material may include a fluorinated fullerene material as discussed above, as well as other variants of such material (e.g., the dopant may include a substituted fullerene material selected from the group of: $C_{60}F_{18}$, $C_{60}F_{24}$, $C_{60}F_{36}$, $C_{60}F_{48}$, $C_{60}F_{44}$ and $C_{70}F_{54}$ or other halogenated fullernes—for example, chlorinated fullerenes). In some implementations, the dopant material is nucleated at C (e.g., the material nucleates upon deposition) to form a nucleated dopant and/or as part of a process used to dope the nanotube 110, which can also be used to set or otherwise control the level of doping. The dopant material can be grown along some or all of the nanotube 110, extending from one or more initial nucleation sites, as part of the deposition/nucleation at a nucleation site and/or as part of continued deposition or another deposition process.

Generally, the doping can be carried out across nanostructures as shown (e.g., across the nanotube 110), or across an entire film of such nanostructures, to form a plurality of conductive structures. In many implementations involving the doping of a film, the Fermi level of the dopant used across the film is less than the Fermi level of a majority of or substantially all of the nanostructures (e.g., more than 75%, more than 85%, or more than 95% of the nanostructures). Where a mixture of nanostructures is present in the film (e.g., semiconducting and metallic nanowires), the Fermi level of the dopant used in the film can be less than a majority of or substantially all of one type of the nanostructures (e.g., the semiconducting nanostructures).

Figure 2:
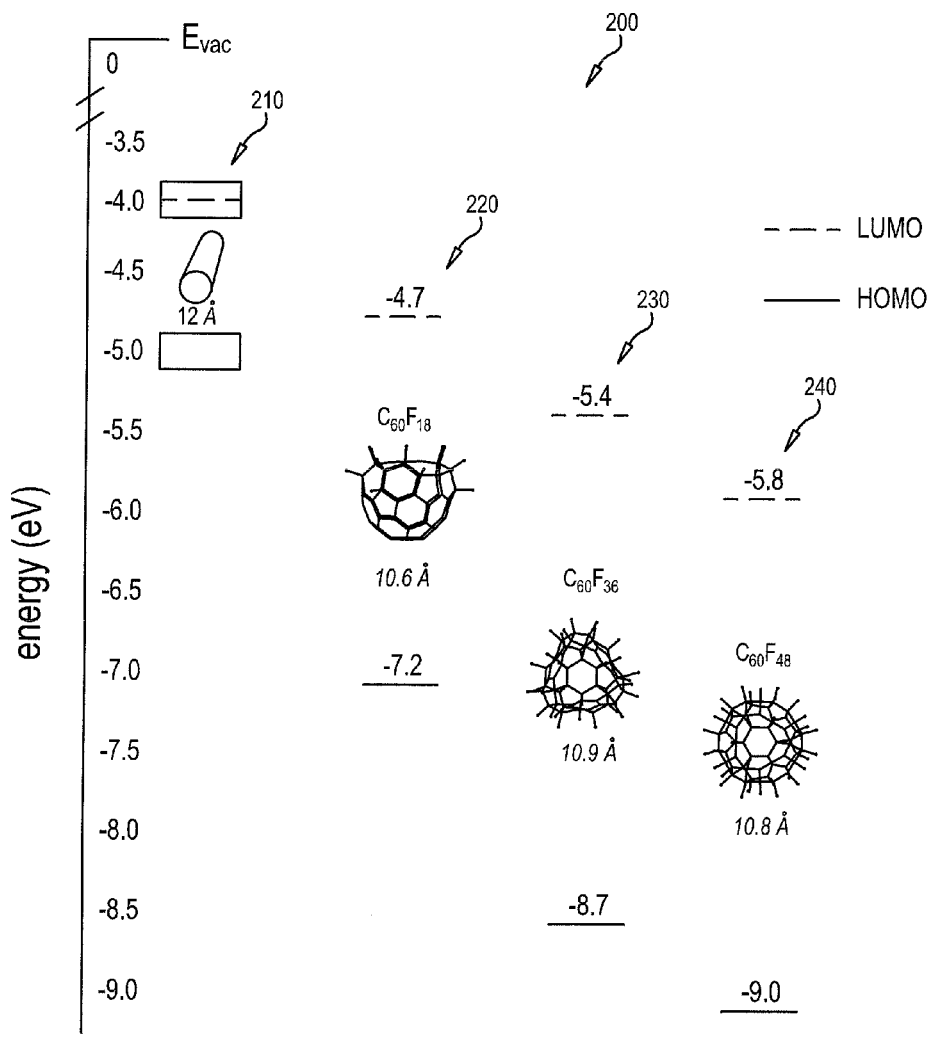
FIG. 2 shows energy levels for carbon nanotubes doped in accordance with various example embodiments of the present invention.

FIG. 2 is a chart 200 showing exemplary energy levels for carbon nanotubes doped in accordance with various example embodiments of the present invention. These exemplary energy levels, (highest occupied molecular orbital (HOMO), and lowest unoccupied molecular orbital (LUMO) are shown for carbon nanotubes doped with different fluorinated dopants, with exemplary values also shown for an un-doped carbon nanotube.

In accordance with various example embodiments, one or more of the dopants as shown in FIG. 2 are used to attain different levels of conductivity in carbon nanotubes. The dopants may be selected based upon a desired conductivity for a particular application, cost or other characteristics of the dopants, or other aspects of devices to be formed using the doped carbon nanotubes. In addition, the amount of dopant used can be set to achieve a desired dopant level (e.g., as shown, fluorinated fullerenes are deposited to a thickness of about 5 nanometers).

Energy levels are shown for a carbon nanotube at 210, and for such a carbon nanotube doped with fluorinated fullerenes including $C_{60}F_{18}$, $C_{60}F_{36}$, and $C_{60}F_{48}$, as respectively shown at 220, 230 and 240. Using the electronegativity of fluorine (F), increased fluorine content is used to greatly lower the fullerene's lowest unoccupied molecular orbital (LUMO). The addition of each F-atom is used to set or lower the LUMO to about 0.05 eV. Correspondingly, one or more other types of halogens may be similarly implemented. In connection with these embodiments, it has been discovered that the Fermi energy of all of fluorinated fullerenes (FFs) is lower than the CNT Fermi energy, and that similar approaches are applicable with other halogens.

Upon equilibration of the CNTs and FF system, the Fermi energies are equalized by electron transfer from the CNT to the FF, which p-dopes (introduces holes) into the CNT. The lowest unoccupied molecular orbitals of $C_{60}F_{36}$, and $C_{60}F_{48}$ can be lower in energy than the CNT HOMO, which is used to facilitate efficient charge-transfer doping.

Figure 3:
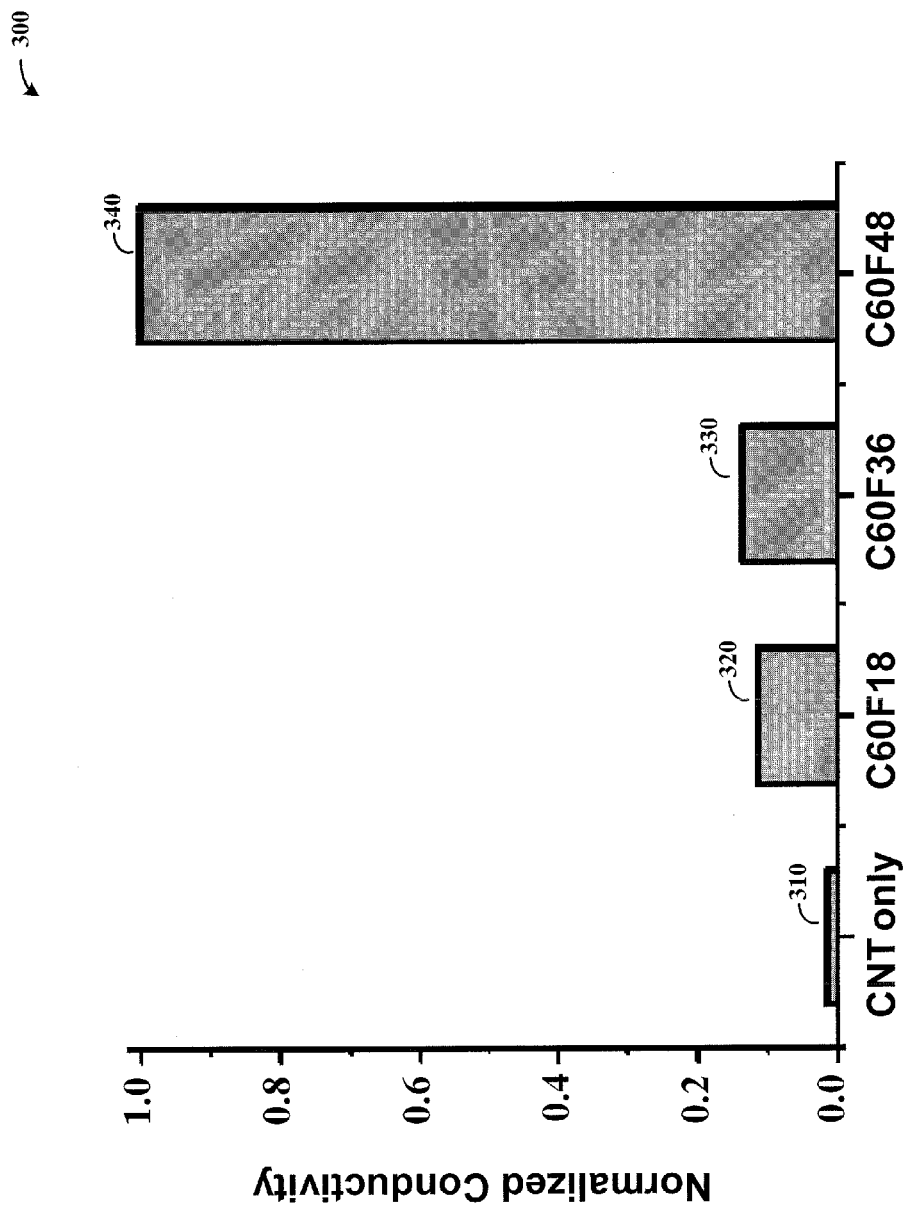
FIG. 3 is a histogram showing carbon nanotubes doped in accordance with various example embodiments of the present invention.

FIG. 3 is a histogram 300 showing carbon nanotubes doped in accordance with various example embodiments of the present invention. An undoped carbon nanotube is represented at 310, and carbon nanotubes doped with fluorinated fullerenes $C_{60}F_{18}$, $C_{60}F_{36}$, and $C_{60}F_{48}$ are respectively shown at 320, 330 and 340.

In connection with these embodiments, it has been recognized/discovered that the doping efficiency, and CNT conductivity, increases with fluorination as shown in FIG. 3. For example, in connection with various experimental embodiments, it has been recognized that the difference in energies between the HOMO of a CNT and the LUMO of a CNT doped with $C_{60}F_{48}$, $$(E_{CNT-HOMO}-E_{C_{60}F_{48}-LUMO})$$

is about ca 0.8 eV (e.g., indicating a doping efficiency of at least unity). Each $C_{60}F_{48}$ molecule in contact with a semiconducting-CNT is used to add at least one hole to the CNT.

In one experimental-type embodiment, the hole concentration (p in holes/cm$^2$) is related to the sheet resistance, SC—CNT mobility $\mu$ (~5-50 cm$^2$/Vs) and elementary charge e by, p=(eµRs)$^{-1}$ and can be set to be around $10^{12}$-$10^{15}$ holes/cm$^2$. The monolayer coverage for one layer of $C_{60}F_{48}$ is ~8×10$^{13}$ molecules/cm$^2$, which is less than the hole concentration, where the $C_{60}F_{48}$ is also doping the CNTs at the sidewalls. The doping efficiency may thus exceed unity, and in some implementations, the $C_{60}F_{48}$ is used to accept two electrons in the LUMO.

In accordance with the above, various embodiments are directed to setting the transparency of a doped nano/microstructure by setting the amount of dopant material. For example, using more dopant material may increase electrical and/or thermal conductivity, yet this may also hinder transparency. In this regard, various embodiments are directed to using a dopant material at an amount that meets desired conductivity levels as well as desired levels of transparency, with trade-offs between conductivity and transparency set for the desired application. In one example implementation, the sheet resistance is set to about 600 Ohms at about 96% transparency on a $C_{60}F_{48}$-doped sparse semiconducting-CNT.

In accordance with various example embodiments and as discovered in connection with the same, in terms of transparency and overall film thickness (which can be set for specific device applications), fluorinated fullerene ($C_{60}F_x$) as discussed herein is used to preferentially grow on carbon nanotubes relative to an underlying substrate upon which the carbon nanotubes are grown. In one implementation, low or minimal loss in transparency is achieved after the deposition of $C_{60}F_{48}$ (as shown in FIG. 2 and/or 3) onto carbon nanotubes, in accordance with the relatively large band gap and (white) color of $C_{60}F_{48}$, making it a poor absorber of light. In some implementations, sheet resistances under 150 Ohms at about 91% transparency are achieved, and in other implementations, sheet resistances of about 60 Ohms are achieved at a transparency of about 92% for joined nanotubes.

Various embodiments described above and shown in the figures may be implemented together and/or in other manners. One or more of the items depicted in the drawings/figures can also be implemented in a more separated or integrated manner, or removed and/or rendered as inoperable in certain cases, as is useful in accordance with particular applications. For example, various embodiments directed to nanostructures may be implemented with microstructures, such as those having diameters or other dimensional characteristics on the order of about 1 nanometer to hundreds of nanometers. Similarly, embodiments characterized using carbon-based structures may be implemented with non-carbon-based structures (e.g., nanotubes of other materials or of hybrid carbon materials), and embodiments involving nanotubes may be implemented using nanowires and carbon fibers, instead of and/or in addition to nanotubes. Moreover, a variety of different doping materials may be used in different applications. In view of the description herein, those skilled in the art will recognize that many changes may be made thereto without departing from the spirit and scope of the present invention.

What is claimed is:

1. A method for doping a carbon nanotube-based nanostructure, the method comprising:
    applying a fullerene-based material to an outer surface of the nanostructure, the fullerene-based material having a Fermi level that is below the Fermi level of the nanostructure;
    using the applied fullerene-based material to grow a fullerene-based dopant material on the nanostructure; and
    doping the surface of the nanostructure with a dopant from the fullerene-based dopant material to effect a charge transfer from the dopant to the nanostructure and form a hybrid material including a portion of the nanostructure and the dopant, the hybrid material exhibiting a conductivity that is greater than a conductivity of the nanostructure, prior to doping via the fullerene-based dopant material.

2. The method of claim 1, further including, prior to applying the fullerene-based material, preparing the fullerene-based material by combining a fullerene with a non-fullerene-based material to set the Fermi level of the fullerene-based material to a level that is less than a Fermi level of the nanostructure.

3. The method of claim 1, further including, prior to applying the fullerene-based material, preparing the fullerene-based material by combining a fullerene with a halogen-based material to form a halogenated fullerene-based material having a Fermi level that is less than a Fermi level of the nanostructure.

4. The method of claim 1, wherein applying a fullerene-based material includes applying a non-polymeric fullerene-based material having a Fermi level that is at least 0.026 eV below the Fermi level of the nanostructure.

5. The method of claim 1, wherein applying a fullerene-based material includes applying a fullerene-based material having a conduction band that is at least 0.026 eV below the lowest energy level in the conduction band of the nanostructure.

6. The method of claim 1, wherein
    applying a fullerene-based material includes applying the fullerene-based material to a plurality of nanostructures forming a sheet,
    using the applied fullerene-based material to grow a fullerene-based dopant material on the nanostructure includes growing a fullerene-based dopant material on the plurality of nanostructures, and
    doping the surface of the nanostructure includes doping the surfaces of the plurality of nanostructures with a dopant from the fullerene-based dopant material to form a hybrid material on each nanostructure, the hybrid material including a portion of the nanostructure and the dopant and exhibiting a conductivity that is greater than a conductivity of the nanostructure, prior to doping via the fullerene-based dopant material, the hybrid material being formed as part of the sheet to configure the sheet to pass at least 90% of light incident thereupon.

7. The method of claim 1, wherein doping the surface of the nanostructure includes reducing the resistance of the nanostructure by at least about 20%.

8. The method of claim 1, wherein applying a fullerene-based material includes applying a halogenated fullerene-based material.

9. The method of claim 1, wherein applying a fullerene-based material includes applying a fluorinated fullerene-based material.

10. The method of claim 1, wherein applying the fullerene-based material includes applying a material selected from the group of $C_{60}F_{18}$, $C_{60}F_{24}$, $C_{60}F_{36}$, $C_{60}F_{44}$, $C_{60}F_{48}$ and $C_{70}F_{54}$.

11. The method of claim 1, wherein
applying the fullerene-based material to the nanostructure includes selecting a thickness of the fullerene-based material to set a transparency of a film including a plurality of the nanostructures, and applying the fullerene-based material to the film of nanostructures at the selected thickness, and
nucleating the fullerene-based material includes nucleating the fullerene-based material at the selected thickness to form a nucleated material on the film and to set the transparency of the film to the set transparency.

12. The method of claim 1, wherein applying a fullerene-based material to a nanostructure includes applying a fullerene-based material to a carbon-based nanostructure.

13. The method of claim 1, wherein doping the nanostructure with the applied material includes reducing a resistance value of the applied material with the dopant, relative to a resistance of the applied material, prior to doping.

14. The method of claim 1, wherein applying a fullerene-based material to the nanostructure includes applying a fullerene-based material to a nanostructure including at least one of a carbon nanotube, a single-walled carbon nanotube, a multi-walled carbon nanotube, a carbon fiber, a semiconducting carbon nanotube, a metallic carbon nanotube, an inorganic nanowire, an organic nanowire, a zinc oxide nanostructure, a silver nanostructure, a gold nanostructure, a silicon nanostructure, graphene and graphene oxide.

15. The method of claim 14, wherein the step of doping includes forming the hybrid material, configured and arranged with the nanowire, to render the nanowire more thermally conductive than the carbon nanotube-based nanostructure.

16. The method of claim 1, wherein applying a fullerene-based material includes depositing the fullerene-based material on the nanostructure from a solution.

17. The method of claim 1, wherein applying a fullerene-based material includes vapor-depositing the fullerene based material on the nanostructure.

18. The method of claim 1, wherein applying a fullerene-based material to a nanostructure includes applying a fullerene-based material that is selective to the nanostructure, to mitigate application of the fullerene-based material to other materials adjacent the nanostructure.

19. The method of claim 1, wherein the steps of applying and using the fullerene-based material include depositing the fullerene-based material on the nanostructure, upon which the fullerene-based material nucleates and grows to form the nucleated fullerene-based material.

20. The method of claim 1, wherein applying a fullerene-based material to a nanostructure includes applying the fullerene-based material to a structure having a thickness of at least about one micrometer.

21. The method of claim 1, wherein
applying a fullerene-based material to a nanostructure includes depositing the fullerene-based material on a coating on the nanostructure, and
nucleating the fullerene-based material includes forming at least some of the nucleated fullerene-based material on the coating.

22. The method of claim 1, wherein the step of doping includes forming the hybrid material having a resistance value that is an order of magnitude less than a resistance value of the carbon nanotube-based nanostructure.

23. The method of claim 1, wherein applying a fullerene-based material to the nanostructure includes applying a fullerene-based material to a nanostructure including a carbon nanotube, and
the step of doping includes forming the hybrid material as a sidewall of the carbon nanotube doped with the fullerene dopant.

24. A method for doping a carbon nanotube-based nanowire, the method comprising:
applying a fullerene-based material to a carbon nanotube-based nanowire, the fullerene-based material including a material selected from the group of $C_{60}F_{18}$, $C_{60}F_{24}$, $C_{60}F_{36}$, $C_{60}F_{48}$, $C_{60}F_{44}$ and $C_{70}F_{54}$;
nucleating the fullerene-based material to form a nucleated fullerene-based material on the carbon nanotube-based nanowire; and
doping the carbon nanotube-based nanowire with the nucleated fullerene-based material.

25. The method of claim 24, wherein the steps of applying and nucleating include depositing the fullerene-based material on the carbon nanotube-based nanowire, wherein the fullerene-based material nucleates on the carbon nanotube-based nanowire.

26. The method of claim 24, wherein
applying the fullerene-based material to a carbon nanotube-based nanowire includes selecting an amount of the fullerene-based material to be deposited on the nanowire to set a transparency of a device including a plurality of nanowires, and applying the fullerene-based material to the plurality of nanowires at the selected amount; and
nucleating the deposited fullerene-based material including nucleating the fullerene-based material to form a nucleated material on the nanowires and to set the transparency of the device to the set transparency.

* * * * *